(12) United States Patent
Tay et al.

(10) Patent No.: US 7,977,780 B2
(45) Date of Patent: Jul. 12, 2011

(54) MULTI-LAYER PACKAGE-ON-PACKAGE SYSTEM

(75) Inventors: Lionel Chien Hui Tay, Singapore (SG); Jairus Legaspi Pisigan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/185,067

(22) Filed: Aug. 1, 2008

(65) Prior Publication Data
US 2010/0025836 A1 Feb. 4, 2010

(51) Int. Cl.
*H01L 23/538* (2006.01)
*H01L 21/56* (2006.01)

(52) U.S. Cl. ......... 257/686; 257/E21.502; 257/E23.169; 438/109

(58) Field of Classification Search .................. 257/685, 257/686, 723, 777, 778, E23.178, E21.502, 257/E27.137, E27.144, E21.161, E25.006, 257/E23.013, E25.021, E25.027, E23.085; 438/106, 109, 110, 368 FOR, 426 FOR
See application file for complete search history.

(56) References Cited

U.S. PATENT DOCUMENTS

| | | | |
|---|---|---|---|
| 7,354,800 B2 | 4/2008 | Carson | |
| 2006/0043559 A1* | 3/2006 | Chow et al. | 257/686 |
| 2007/0001296 A1 | 1/2007 | Lee et al. | |
| 2007/0181990 A1 | 8/2007 | Huang et al. | |
| 2008/0131999 A1* | 6/2008 | Takiar et al. | 438/109 |
| 2008/0157325 A1* | 7/2008 | Chow et al. | 257/686 |
| 2009/0273094 A1* | 11/2009 | Ha et al. | 257/777 |

* cited by examiner

*Primary Examiner* — Victor Mandala
*Assistant Examiner* — Whitney Moore
(74) *Attorney, Agent, or Firm* — Mikio Ishimaru (57) ABSTRACT

A package-on-package system includes: providing a bottom package module incorporating a bottom package substrate; attaching a central internal stacking module, incorporating a central interposer, on top of the bottom package module; placing a spacer on the top surface of the central internal stacking module; mounting a first top package module, incorporating a first top interposer with an opening, on the spacer; and enclosing at least portions of the bottom package module, the central internal stacking module, and the first top package module with an encapsulant.

20 Claims, 7 Drawing Sheets

MULTI-LAYER PACKAGE-ON-PACKAGE SYSTEM

TECHNICAL FIELD

The present invention relates generally to semiconductor packaging technology, and more particularly to a multi-layer package on package system.

BACKGROUND ART

As new generations of electrical consumer products are developed, there is a growing need for miniaturization of components, integration of several system functions within a component, and improvement of component performance and reliability. Advances in semiconductor package technology continue to enable miniaturization, greater system integration, and greater reliability while reducing the overall cost of consumer devices.

These trends have resulted in a requirement for increased circuit density and have led to the development of multi-chip packages incorporating more than one semiconductor die. Each package provides mechanical support for an individual semiconductor die and one or more layers of interconnect lines that enable the integrated circuits to be connected electrically to surrounding circuitry within separate semiconductor dies.

Current multi-chip packages, also commonly referred to as multi-chip modules, typically consist of a PCB substrate onto which a set of separate semiconductor dies is directly attached. The reliable implementation of multi-chip packages may be impacted when several semiconductor dies are arranged vertically or horizontally in the package because one critical defect induces a complete package failure, which is costly.

Moreover, vertically stacked semiconductor dies in typical multi-chip packages can present problems beyond those of horizontally arranged integrated circuit packages, further complicating the manufacturing process. It is more difficult to test and thus determine the actual failure mode of the individual semiconductor die. Moreover individual semiconductor dies are often damaged during assembly or testing, complicating the manufacturing process and increasing costs, since a single semiconductor die or interconnect defect results in the failure of the multi-chip package.

Thus, a need still remains for a means for creating multi-layer package systems incorporating several semiconductor dies that can be assembled using pre-tested modules, also known as Known Good Packages (KGP). In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a package-on-package system including: providing a bottom package module incorporating a bottom package substrate; attaching a central internal stacking module, incorporating a central interposer, on top of the bottom package module; placing a spacer on the top surface of the central internal stacking module; mounting a first top package module, incorporating a first top interposer with an opening, on the spacer; and enclosing at least portions of the bottom package module, the central internal stacking module, and the first top package module with an encapsulant.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the first top package module, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements. The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Figure 1:
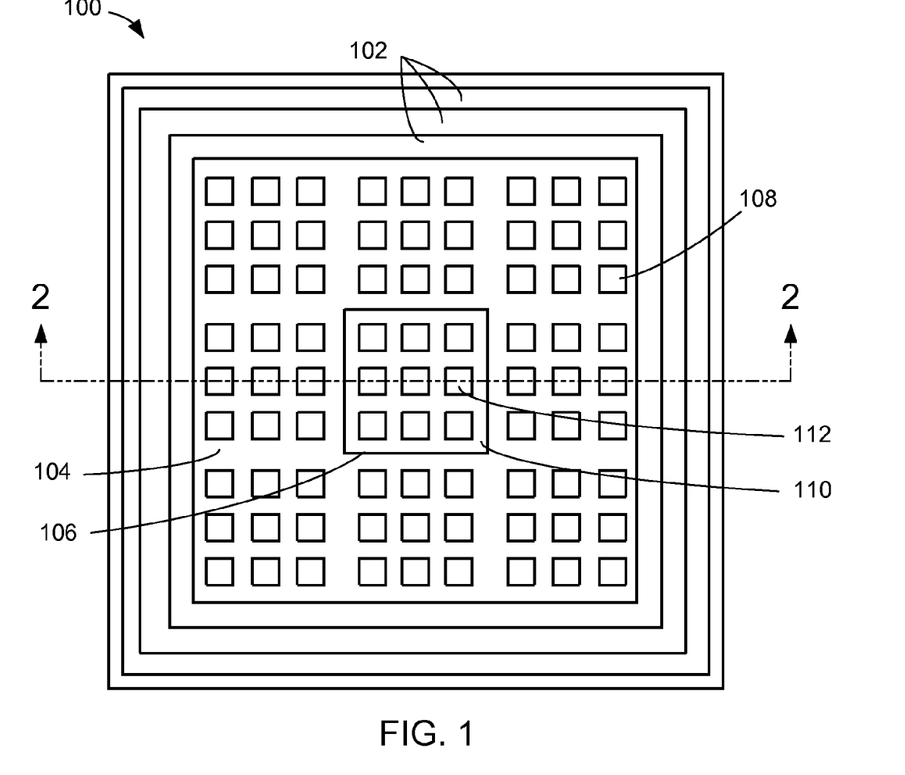
FIG. 1 is a top plan view of a package-on-package system in one embodiment of the present invention.

Referring now to FIG. 1, therein is shown a top plan view of a package-on-package system 100 in one embodiment of the present invention. An encapsulant 102 covers portions of the periphery of a first top interposer 104 with an opening 106. The first top interposer 104 includes a contact pad 108 for making connections to another system level such as a top semiconductor device (not shown). The opening 106 exposes portions the center of a central interposer 110 and an upper contact pad 112 on the top surface of the central interposer 110. The first top interposer 104 is mounted covering a perimeter of the central interposer 110.

Figure 2:
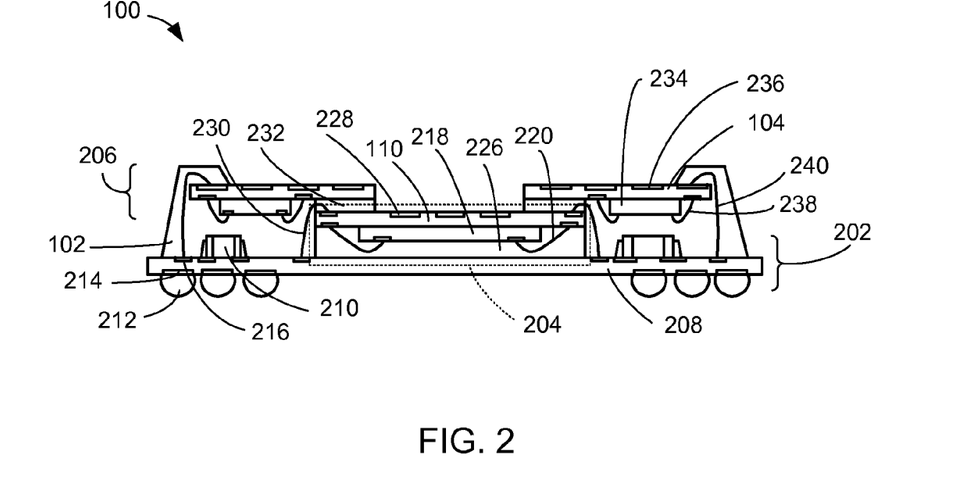
FIG. 2 is a cross-section of the package-on-package system taken along line 2-2 in FIG. 1.

Referring now to FIG. 2, therein is shown a cross-section of the package-on-package system 100 taken along line 2-2 in FIG. 1. The package-on-package system 100 includes three package subassemblies: a bottom package module 202, a central internal stacking module 204, and a first top package module 206. The encapsulant 102 covers at least portions of the bottom package module 202, the central internal stacking module 204, and the first top package module 206.

In the preferred embodiment of the invention modular components of the package-on-package system are pre-tested and classified as Known Good Packages (KGP). The modularity provided by the package subassemblies significantly increases the manufacturing yield in the fabrication of the package-on-package system 100.

The bottom package module 202 includes a bottom package substrate 208 supporting a passive component 210 such as a precision resistor, a capacitor, an inductor, an antenna, or a radio-frequency (RF) component among others. The bottom package substrate 208 provides an interface for connecting the package-on-package system 100 to the next level through an inter-package interconnect 212, such as a solder bump or a solder ball.

The bottom package substrate 208 includes a bottom contact pad 214 on its lower surface as well as an upper contact pad 216 on its top surface. The bottom contact pad 214 and the upper contact pad 216 in the bottom package substrate 208 are connected to conductive surface traces (not shown) and directly or indirectly connected to conductive through vias (not shown) interconnecting conductive surface traces on the top surface to conductive surface traces arranged on the bottom surface of the bottom package substrate 208.

The bottom contact pad 214 in the bottom package substrate 208 is employed as an electrical connection point to the package-on-package system 100. The bottom contact pad 214 primarily supports connections to the next package level through the inter-package interconnect 212. Similarly, the upper contact pad 216 is used to connect the passive component 210 or other package modules to the bottom package substrate 208.

The central internal stacking module 204 is attached to the top surface of the bottom package substrate 208. In the preferred embodiment of the invention, the central internal stacking module 204 is pre-tested and classified as a Known Good Package (KGP). The central internal stacking module 204 includes the central interposer 110, a central semiconductor die 218 attached to the central interposer 110, a bond wire 220 connecting the central semiconductor die 218 to the central interposer 110, and a central encapsulant 226 covering at least portions of the central interposer 110, the central semiconductor die 218, and the bond wire 220.

The top surface of the central interposer 110 includes an upper contact pad 228 for connections to another system level (not shown) of the package-on-package system 100. Contact pads in the central interposer 110 such as the upper contact pad 228 are connected to conductive surface traces (not shown) and directly or indirectly connected to conductive through vias (not shown) interconnecting conductive surface traces on the top surface to conductive surface traces arranged on the bottom surface.

Power, ground, or signals between the central internal stacking module 204 and the bottom package module 202 are routed through an inter-package bond wire 230 connecting the central interposer 110 to the bottom package substrate 208. Portions of the inter-package bond wire 230 are encapsulated within a spacer 232.

In the preferred embodiment of the invention the spacer 232 is formed using a penetrable material such as a wire in film adhesive. The term "penetrable material" as used herein is defined as an encapsulation material that can be applied in a soft state and which can be cured to a rigid state. A penetrable material is generally used to prevent bond wire movement, also known as "wire sweep," during the application of the encapsulant. The spacer 232 separates the first top package module 206 from the central internal stacking module 204.

The first top package module 206 includes the first top interposer 104 and a device 234 mounted in the periphery of the bottom surface of the first top interposer 104. The device 234 faces the passive component 210. The device 234 is a generic element that may be implemented as a passive component, a semiconductor die, or a flip-chip die among others. For illustration purposes the device 234 is shown as a wire-bonded semiconductor device. The first top interposer 104 includes an upper contact pad 236 for connections to another system level (not shown).

Contact pads in the first top interposer 104 such as the upper contact pad 236 are connected to conductive surface traces (not shown) and directly or indirectly connected to conductive through vias (not shown) interconnecting conductive surface traces on the top surface to conductive surface traces arranged on the bottom surface.

An electrical connection between the device 234 and the first top interposer 104 is implemented using a bond wire 238. The first top package module 206 is electrically connected to the bottom package module 202 using an inter-package bond wire 240 connecting the first top interposer 104 to the bottom package substrate 208.

Figure 3:
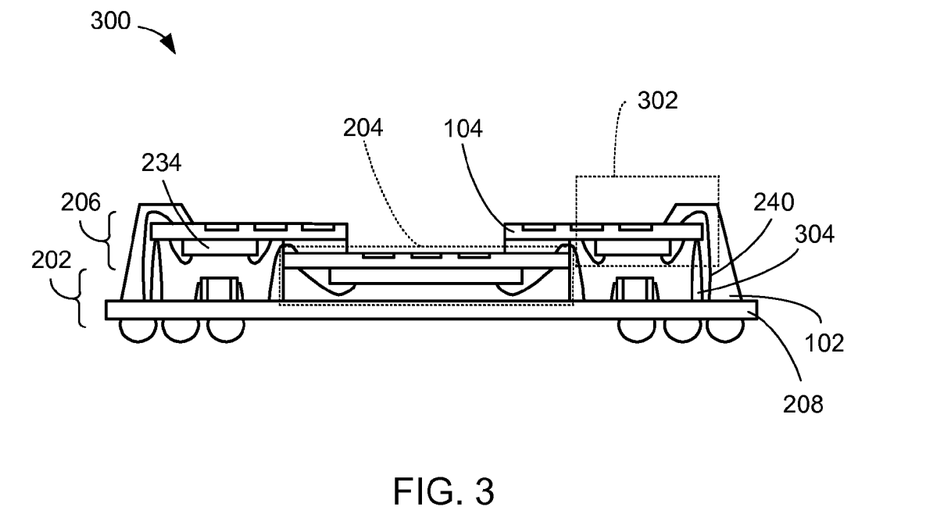
FIG. 3 is a cross-section of a package-on-package system in a second embodiment of the present invention.

Referring now to FIG. 3, therein is shown a cross-section of a package-on-package system 300 in a second embodiment of the present invention. The top plan view corresponding to the cross-section shown in FIG. 3 is identical to the top plan view for the package-on-package system 100 shown in FIG. 1. Several contacts pads included in FIG. 2 are not shown in FIG. 3 in order to simplify the cross-section.

The package-on-package system 300 incorporates the bottom package module 202, the central internal stacking module 204, the first top package module 206, and the encapsulant 102. The embodiment of the invention represented by the package-on-package system 300 addresses the problem of potential down-deflection of an overhang portion 302 of the first top interposer 104 during wire bonding of, for example, the inter-package bond wire 240.

Excessive down-deflection of the overhang portion 302 of the first top interposer 104 could potentially damage the first top interposer 104 or interconnections between the device 234 and the first top interposer 104. Thus, an epoxy pillar 304 is provided to support the overhang portion 302 of the first top interposer 104. The epoxy pillar 304 is placed on top of the bottom package substrate 208, and may be configured as a single pillar or as continuous line placed around the central internal stacking module 204 under the overhang portion 302 of the first top interposer 104.

Figure 4:
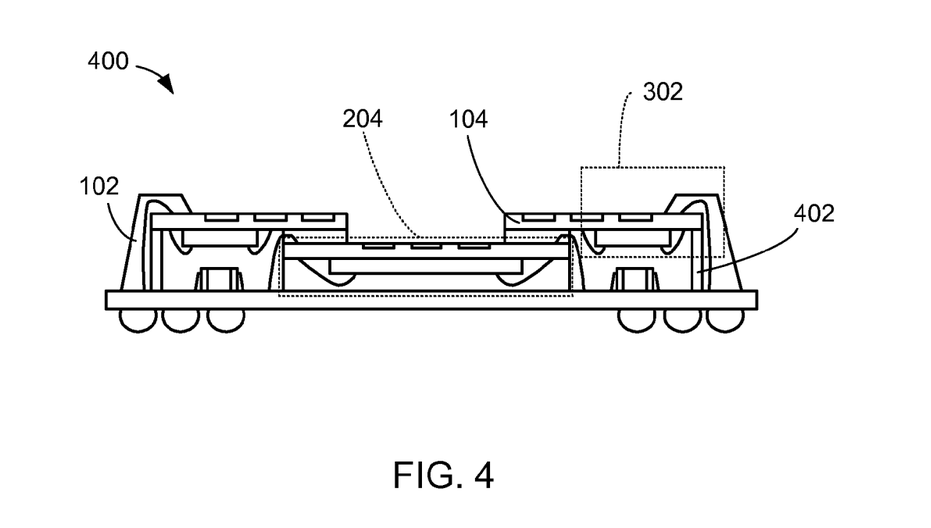
FIG. 4 is a cross-section of a package-on-package system in a third embodiment of the present invention.

Referring now to FIG. 4, therein is shown a cross-section of a package-on-package system 400 in a third embodiment of the present invention. The top plan view corresponding to the cross-section shown in FIG. 4 is identical to the top plan view for the package-on-package system 100 shown in FIG. 1. Several contacts pads included in FIG. 2 are not shown in FIG. 4 in order to simplify the cross-section.

The embodiment of the invention shown in FIG. 4 includes the same elements as the structure shown in FIG. 3 with the exception that the epoxy pillar 304 shown in FIG. 3 is replaced with a support element 402, such as a pillar made out of any material suitable for packaging, or a continuous line of the same material placed around the central internal stacking module 204 under the overhang portion 302 of the first top interposer 104. Suitable materials for the support element include metals and polyimides.

Figure 5:
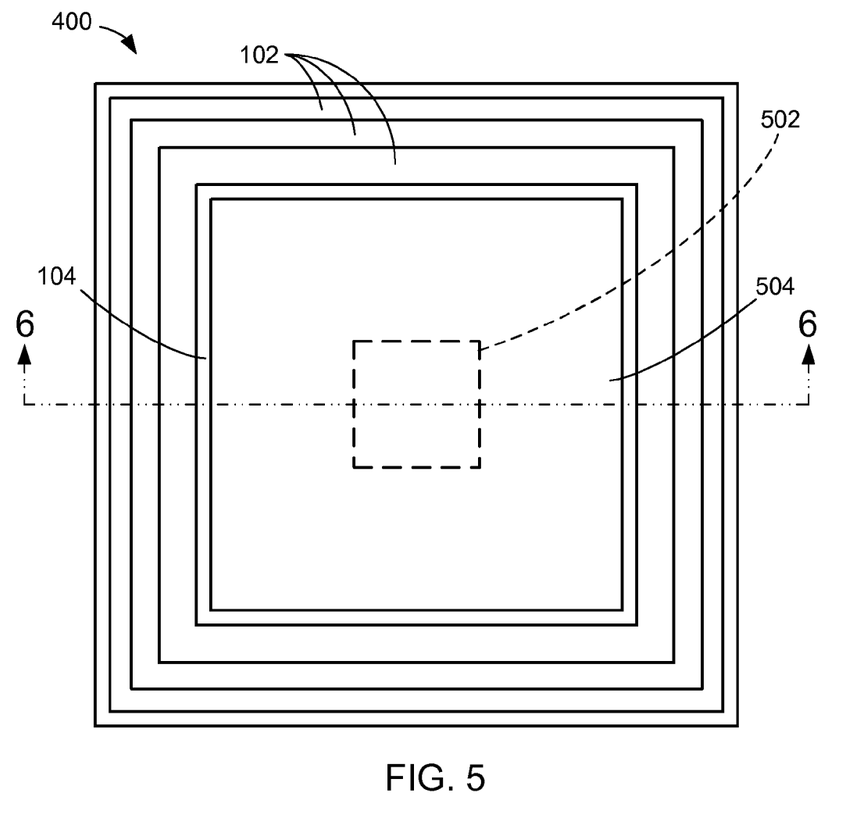
FIG. 5 is a top plan view of the package-on-package system incorporating two additional known good devices.

Referring now to FIG. 5, therein is shown a top plan view of the package-on-package system 400 incorporating two additional known good devices. A central known good device 502 (shown with hidden lines) is mounted inside the opening 106 shown in FIG. 1. A top known good device 504 is mounted on top of the first top interposer 104 and the central known good device 502. The encapsulant 102 covers portions of the periphery of the first top interposer 104. The central known good device 502 and the second good known devices are pre-tested flip-chip semiconductor devices or pre-tested package modules.

Figure 6:
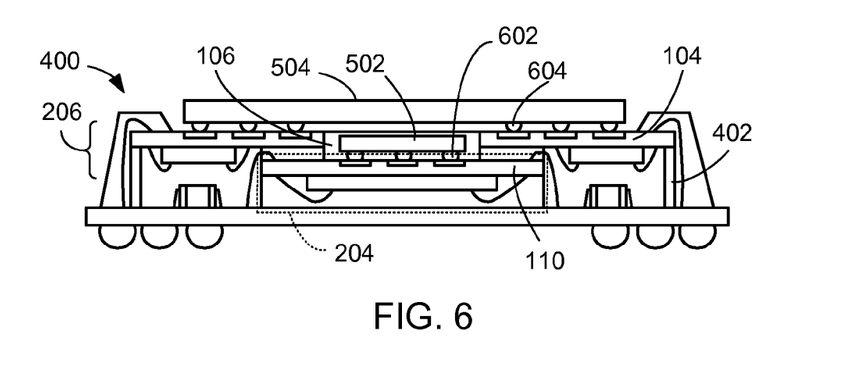
FIG. 6 is a cross-section of a package-on-package system with two known good devices mounted on it, taken along line 6-6 in FIG. 5.

Referring now to FIG. 6, therein is shown a cross-section of a package-on-package system 400 with two known good devices mounted on it, taken along line 6-6 in FIG. 5. Several contact pads are not shown in order to simplify the cross-section shown in FIG. 6.

The central known good device 502 is mounted inside the opening 106 and on top of the central interposer 110 using an interconnect 602, such as a solder bump or ball. The top known good device 504 is mounted on top of the first top interposer 104 using an interconnect 604 which may also be implemented using a solder bump or ball. Thus the central known good device 502 may be connected to the central internal stacking module 204 and second good known device may be mounted on top of the first top package module 206.

Figure 7:
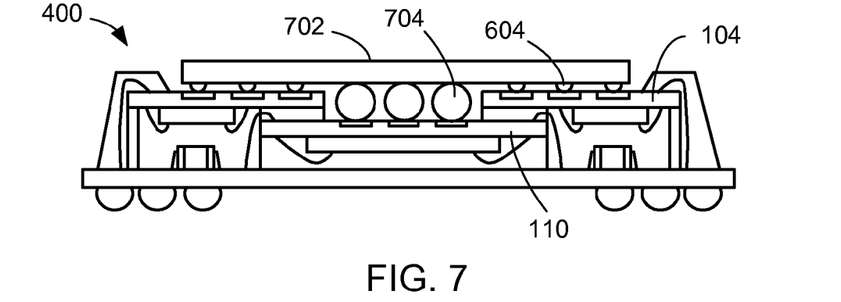
FIG. 7 a cross-section of a package-on-package system incorporating a top known good device.

Referring now to FIG. 7, therein is shown a cross-section of a package-on-package system 400 incorporating a top known good device 702. In this embodiment of the invention the top known good device 702 can support a large interconnect 704 and is mounted on both the first top interposer 104 and the central interposer 110. The interconnect 604 is used to connect the top known good device 702 to the first top interposer 104, and the large interconnect 704 is used to connect the top known good device 702 to the central interposer 110. The large interconnect 704 may be implemented using a solder bump or ball with the appropriate dimensions.

Figure 8:
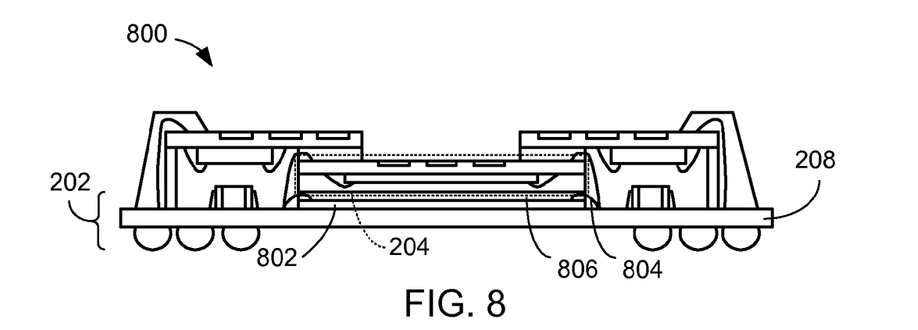
FIG. 8 is a cross-section of a package on package system in a fourth embodiment of the present invention.

Referring now to FIG. 8, therein is shown a cross-section of a package on package system 800 in a fourth embodiment of the present invention. The package on-package system 800 includes a bottom semiconductor die 802 mounted on top of the bottom package module 202. The bottom semiconductor die 802 is connected to the bottom package substrate 208 using a bond wire 804.

A penetrable material 806, such as a wire in film adhesive, encapsulates the bond wire 804 and functions as a spacer between the bottom semiconductor die 802 and the central internal stacking module 204.

Figure 9:
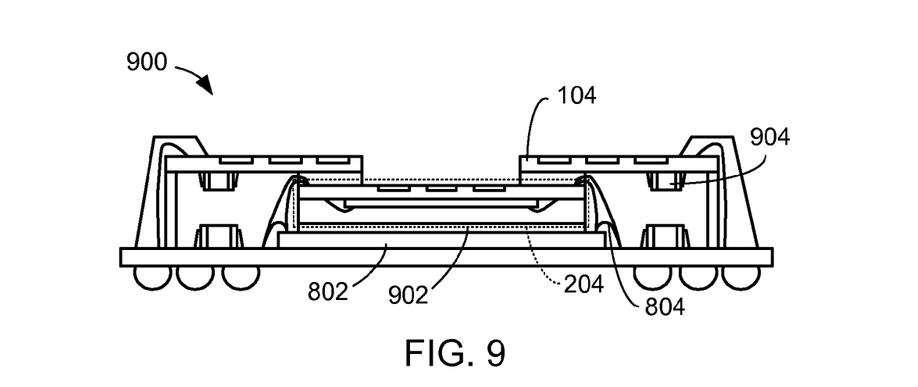
FIG. 9 is a cross-section of a package on package system in a fifth embodiment of the present invention.

Referring now to FIG. 9, therein is shown a cross-section of a package on package system 900 in a fifth embodiment of the present invention. The package-on-package system 900 incorporates a spacer 902 separating the central internal stacking module 204 from the bottom semiconductor die 802. In addition, the spacer 902 is narrower than the bottom semiconductor die 802, creating sufficient horizontal space for the bond wire 804. The spacer 902 may be implemented using an adhesive, a metal, or a polyimide film among other options.

As an example, a passive component 904 is shown mounted on the bottom periphery of the first top interposer 104 as one embodiment of the device 234 shown in FIG. 2.

Figure 10:
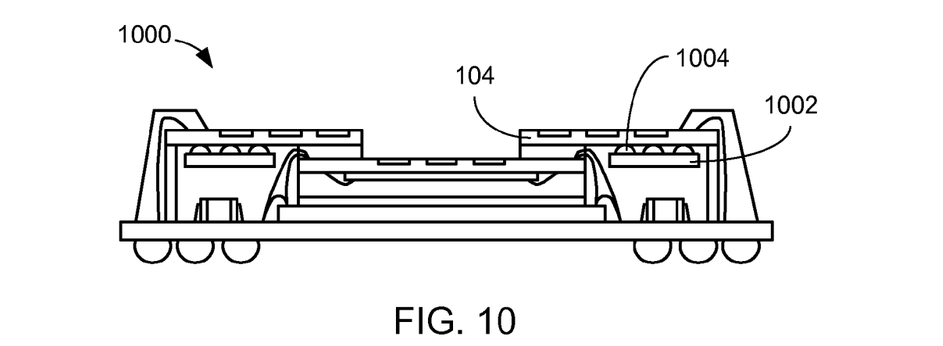
FIG. 10 is a cross-section of a package-on-package system in a sixth embodiment of the present invention.

Referring now to FIG. 10, therein is shown a cross-section of a package-on-package system 1000 in a sixth embodiment of the present invention. The package-on-package system 1000 has the same configuration as the package-on-package system 900 of FIG. 9, with the exception that the passive component 904 of FIG. 9 is replaced with a flip-chip semiconductor device 1002, which is connected to the bottom periphery of the first top interposer 104 using an interconnect 1004.

Figure 11:
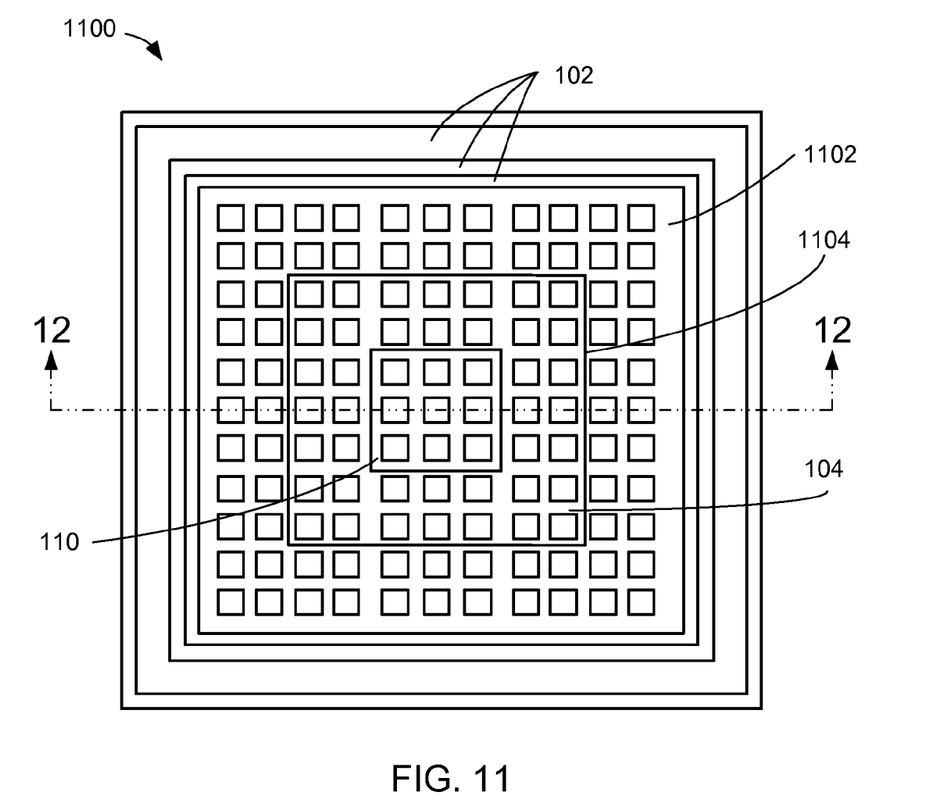
FIG. 11 is a plan top view of a package-on-package system in a seventh embodiment of the present invention.

Referring now to FIG. 11, therein is shown a plan top view of a package-on-package system 1100 in a seventh embodiment of the present invention. The encapsulant 102 covers portions of the periphery of a second top interposer 1102 with an opening 1104. The second top interposer 1102 includes a contact pad 1106 for making connections to another system level such as a top semiconductor device (not shown). The opening 1104 exposes portions of the first top interposer 104 and portions of the central interposer 110.

Figure 12:
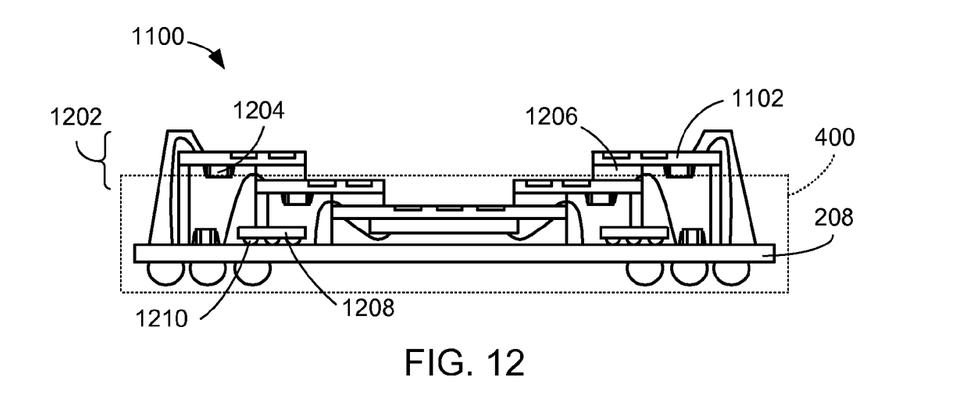
FIG. 12 a cross-section of a package-on-package system taken along line 12-12 in FIG. 11.

Referring now to FIG. 12, therein is shown a cross-section of a package-on-package system 1100 taken along line 12-12 in FIG. 11. The package-on-package system 1100 includes the package-on-package system 400 as a base structure. A second top package module 1202 incorporating the second top interposer 1102 and a device 1204 are stacked on the package-on-package system 400 to form the package-on-package system 1100.

The configuration of the second top package module 1202 is similar to the configuration of the first top package module 206 of FIG. 3. Thus the second top package module 1202 can support a device 1204 which may be a passive component or a semiconductor device. For illustration purposes the device 1204 in the second top package module 1202 is shown as a passive component.

The second top package module 1202 is mounted on top of the package-on-package system 400 using a spacer 1206. In the preferred embodiment of the package-on-package system 1100, the spacer 1206 is formed using a penetrable material such as a wire in film adhesive. The embodiment of the package-on-package system 1100 shown in FIG. 12 may be expanded to incorporate additional top interposers. For example, the package-on-package system 1100 may include a third top interposer, a fourth top interposer, and so forth.

In the embodiment of the package on package system 1100 shown in FIG. 12, the package-on-package system 400 incorporates a second bottom device 1208 mounted on the bottom package substrate 208 using an interconnect 1210. The second bottom device may be a flip-chip semiconductor device among other options.

Figure 13:
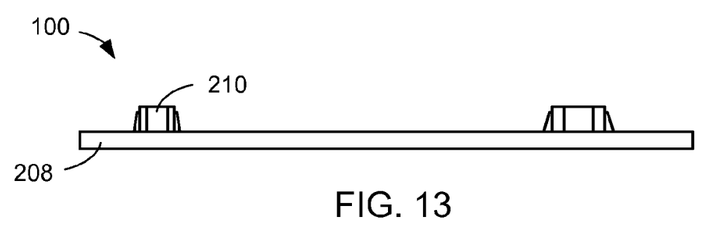
FIG. 13 is a cross-section of the package-on-package system at the initial stage of the manufacturing process.

Referring now to FIG. 13, therein is shown a cross-section of the package-on-package system 100 at the initial stage of the manufacturing process. In the first stage of the manufacturing process, the passive component 210 is attached to the top surface of the bottom package substrate 208.

Figure 14:
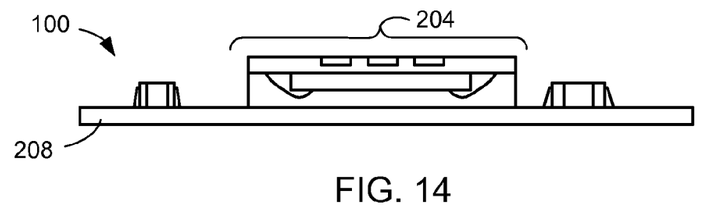
FIG. 14 is the structure of FIG. 13 following the attachment of the central internal stacking module to the top surface of the bottom package substrate.

Referring now to FIG. 14, therein is shown the structure of FIG. 13 following the attachment of the central internal stacking module 204 to the top surface of the bottom package substrate 208. The central internal stacking module 204 is a pre-tested module classified as a Known Good Package.

Figure 15:
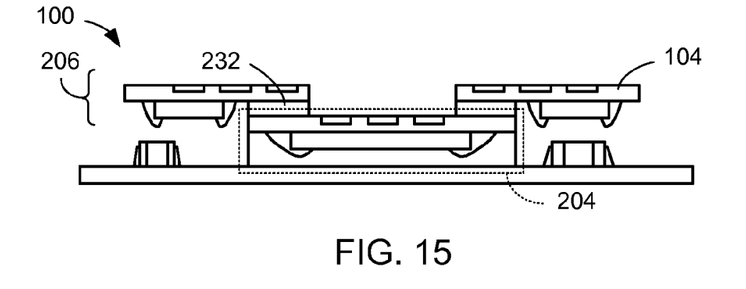
FIG. 15 is the structure of FIG. 14 following the mounting of the first top package module over the central internal stacking module.

Referring now to FIG. 15, therein is shown the structure of FIG. 14 following the mounting of the first top package module 206 over the central internal stacking module 204. The first top package module 206 is a pre-tested module classified as a Known Good Package. The spacer 232 is applied to periphery of the central interposer 110 and then the first top package module 206 is attached to the spacer 232.

Figure 16:
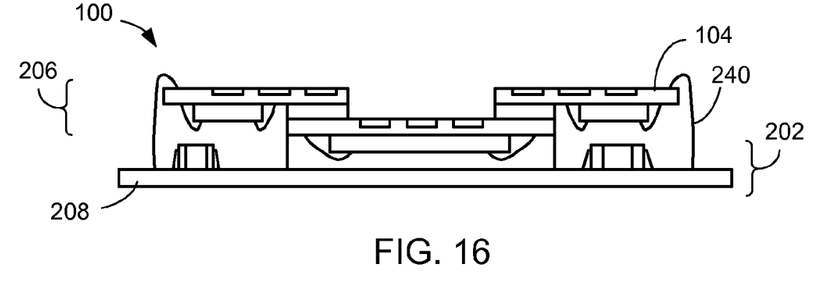
FIG. 16 is the structure of FIG. 15 following wire-bonding the first top package module to the bottom package module.

Referring now to FIG. 16, is shown the structure of FIG. 15 following wire-bonding the first top package module 206 to the bottom package module 202. In this step of the manufacturing process for the package-on-package system 100, the first top interposer 104 in the first top package module 206 is connected to the bottom substrate 208 in the bottom package module 202 using the inert-package wire bond 240.

Figure 17:
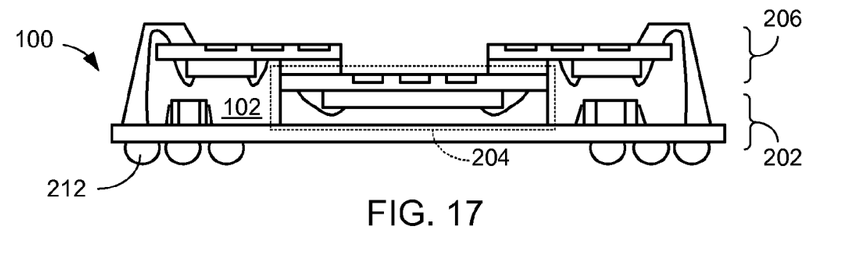
FIG. 17 is the structure of FIG. 16 following the encapsulation in the final step of the fabrication process of the package-on-package system.

Referring now to FIG. 17, therein is shown the structure of FIG. 16 following the encapsulation in the final step of the fabrication process of the package-on-package system 100. In this final step of the manufacturing process for the package-on-package system 100, the encapsulant 102, such as a molding compound, is applied around at least portions of the bottom package model 202, the central internal stacking module 204, and the first top package module 206. The inter-package interconnect 212 is provided for mounting the package-on-package system 100 to the next level.

Figure 18:
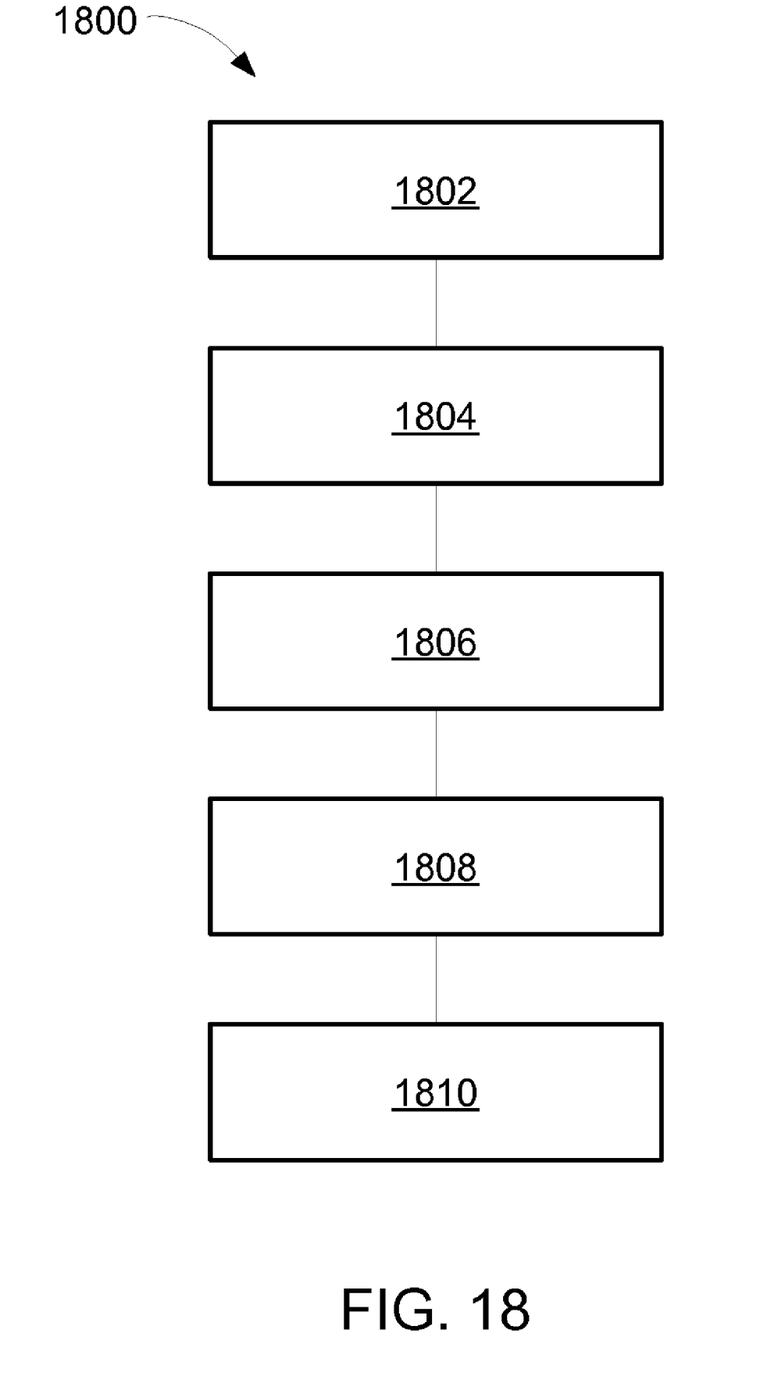
FIG. 18 is a flow chart of a system for manufacturing package-on-package system of FIG. 1 and FIG. 2 in an embodiment of the present invention.

Referring now to FIG. 18, therein is shown a flow chart of a system 1800 for manufacturing package-on-package system 100 of FIG. 1 and FIG. 2 in an embodiment of the present invention. The system 1800 includes providing a bottom package module incorporating a bottom package substrate in a block 1802; attaching a central internal stacking module, incorporating a central interposer, on top of the bottom package module in a block 1804; placing a spacer on the top surface of the central internal stacking module in a block 1806; mounting a first top package module, incorporating a first top interposer with an opening, on the spacer in a block 1808; and enclosing at least portions of the bottom package module, the central internal stacking module, and the first top package module with an encapsulant in a block 1810.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a package-on-package system comprising:
   providing a bottom package module, having an inter-package bond wire, incorporating a bottom package substrate having a passive component;
   attaching a central internal stacking module, incorporating a central interposer, on top of the bottom package module;
   placing a spacer, partially encapsulating the inter-package bond wire, on the top surface of the central internal stacking module;
   mounting a first top package module, incorporating a first top interposer covering a perimeter of the central interposer and having an opening exposing the center of the central interposer, on the spacer and the first top package module includes a device on a bottom surface of the first top interposer with the device facing the passive component; and
   enclosing at least portions of the bottom package module, the central internal stacking module, and the first top package module with an encapsulant.

2. The method as claimed in claim 1 further comprising mounting a support element or an epoxy pillar between the bottom package substrate and the first top package module.

3. The method as claimed in claim 1 further comprising mounting a central known good device on top of the central interposer of the central internal stacking module using an interconnect.

4. The method as claimed in claim 1 further comprising mounting a top known good device on top of the first top interposer of the first top package module using an interconnect.

5. The method as claimed in claim 1 further comprising:
   applying a spacer to the periphery of the first top interposer; and
   mounting a second top package module incorporating a second top interposer with an opening on the spacer.

6. A method for manufacturing a package-on-package system comprising:
   providing a bottom package module, having an inter-package bond wire, incorporating a bottom package substrate, and a passive component or a second bottom device;
   attaching a central internal stacking module, incorporating a central interposer and a central semiconductor die, on top of the bottom package module;
   placing spacer, partially encapsulating the inter-package bond wire, on the top surface of the central internal stacking module;

mounting a first top package module, incorporating a first top interposer covering a perimeter of the central interposer and having an opening exposing the center of the central interposer, on the spacer and the first top package module includes a device on the bottom surface of the first top interposer with the device facing the passive component;

connecting the first top interposer to the bottom package substrate using an inter-package bond wire; and enclosing at least portions of the bottom package module, the central internal stacking module, and the first top package module with an encapsulant.

7. The method as claimed in claim 6 further comprising mounting a support element or an epoxy pillar between the bottom package substrate and the first top package module.

8. The method as claimed in claim 6 further comprising mounting a central known good device on top of the central interposer of the central internal stacking module using an interconnect.

9. The method as claimed in claim 6 further comprising mounting a top known good device on top of the first top interposer of the first top package module using an interconnect.

10. The method as claimed in claim 6 further comprising:
placing a spacer to the periphery of the first top interposer; and
mounting a second top package module, incorporating a second top interposer with an opening, on the spacer.

11. A package-on-package system comprising:
a bottom package module, having an inter-package bond wire, incorporating a bottom package substrate having a passive component;
a central internal stacking module, incorporating a central interposer, attached top of the bottom package module;
a spacer, partially encapsulating the inter-package bond wire, placed on the top surface of the central internal stacking module;
a first top package module, incorporating a first top interposer covering a perimeter of the central interposer and having an opening exposing the center of the central interposer, mounted on the spacer and the first top package module includes a device on a bottom surface of the first top interposer with the device facing the passive component; and
an encapsulant enclosing at least portions of the bottom package module, the central internal stacking module, and the first top package module.

12. The system as claimed in claim 11 further comprising a support element or an epoxy pillar mounted between the bottom package substrate and the first top package module.

13. The system as claimed in claim 11 further comprising a central known good device mounted on top of the central interposer of the central internal stacking module using an interconnect.

14. The system as claimed in claim 11 further comprising a top known good device mounted on top of the first top interposer of the first top package module using an interconnect.

15. The system as claimed in claim 11 further comprising:
a spacer placed on the periphery of the first top interposer; and
a second top package module, incorporating a second top interposer with an opening, mounted on the spacer.

16. The system as claimed in claim 11 further comprising:
a passive component or a second bottom device incorporated within the bottom package module;
a central semiconductor die incorporated within the central internal stacking module;
a device incorporated within the first top package module; and
the inter-package bond wire connecting the top interposer to the bottom package substrate.

17. The system as claimed in claim 16 further comprising a support element or an epoxy pillar mounted between the bottom package substrate and the first top package module.

18. The system as claimed in claim 16 further comprising a central known good device mounted on top of the central interposer of the central internal stacking module using an interconnect.

19. The system as claimed in claim 16 further comprising a top known good device mounted on top of the first top interposer of the first top package module using an interconnect.

20. The system as claimed in claim 16 further comprising:
a spacer placed on the periphery of the first top interposer; and
a second top package module, incorporating a second top interposer with an opening, mounted on the spacer.

* * * * *

UNITED STATES PATENT AND TRADEMARK OFFICE
CERTIFICATE OF CORRECTION

PATENT NO. : 7,977,780 B2  
APPLICATION NO. : 12/185067  
DATED : July 12, 2011  
INVENTOR(S) : Tay et al.

Page 1 of 1

It is certified that error appears in the above-identified patent and that said Letters Patent is hereby corrected as shown below:

Column 3:
line 39, delete "portions" before "the center of a central interposer"

Column 8:
claim 6, line 65, delete "placing spacer," and insert therefor --placing a spacer,--

Signed and Sealed this
Fifth Day of June, 2012

David J. Kappos
*Director of the United States Patent and Trademark Office*